(12) United States Patent
Feng et al.

(10) Patent No.: US 12,022,667 B2
(45) Date of Patent: Jun. 25, 2024

(54) SELF-SELECTIVE MULTI-TERMINAL MEMTRANSISTOR FOR CROSSBAR ARRAY CIRCUITS

(71) Applicant: National University of Singapore, Singapore (SG)

(72) Inventors: Xuewei Feng, Singapore (SG); Kah Wee Ang, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 430 days.

(21) Appl. No.: 17/521,347

(22) Filed: Nov. 8, 2021

(65) Prior Publication Data

US 2022/0149115 A1  May 12, 2022

(51) Int. Cl.
| | | |
|---|---|---|
| H01L 27/24 | (2006.01) | |
| G11C 13/00 | (2006.01) | |
| H10B 63/00 | (2023.01) | |
| H10N 70/00 | (2023.01) | |
| H10N 70/20 | (2023.01) | |

(52) U.S. Cl.
CPC ......... *H10B 63/84* (2023.02); *G11C 13/0002* (2013.01); *H10N 70/011* (2023.02); *H10N 70/253* (2023.02)

(58) Field of Classification Search
CPC .... H10B 63/84; H10B 63/80; G11C 13/0002; G11C 11/54; G11C 11/56; G11C 2013/0078; G11C 2213/15; G11C 13/0069; G11C 2213/53; G11C 2213/77; G11C 13/003; H10N 70/011; H10N 70/253; H10N 70/023; H10N 70/24; H10N 70/823; H10N 70/8822

See application file for complete search history.

(56) References Cited

U.S. PATENT DOCUMENTS

2021/0098611 A1* 4/2021 Hersam ............. G11C 13/0007
2021/0175419 A1* 6/2021 Sangwan ........... G11C 13/0002

* cited by examiner

*Primary Examiner* — Mohammed R Alam
(74) *Attorney, Agent, or Firm* — Mark H. Whittenberger; Holland & Knight LLP

(57) ABSTRACT

This disclosure describes a self-selective multi-terminal memtransistor suitable for use in crossbar array circuits. In particular, the memtransistor comprises a sapphire substrate that has a single-layer of polycrystalline molybdenum disulphide (MoS2) thin film formed on the surface of the substrate, wherein the MoS2 thin film comprise MoS2 grains that are oriented along terraces provided on the surface of the substrate. The memtransistor has a drain electrode and a source electrode that is formed on the MoS2 thin film such that a channel is defined in the MoS2 thin film between the drain and source electrodes, and a gate electrode formed above the channel, whereby the gate electrode is isolated from the channel by a gate dielectric layer.

20 Claims, 9 Drawing Sheets

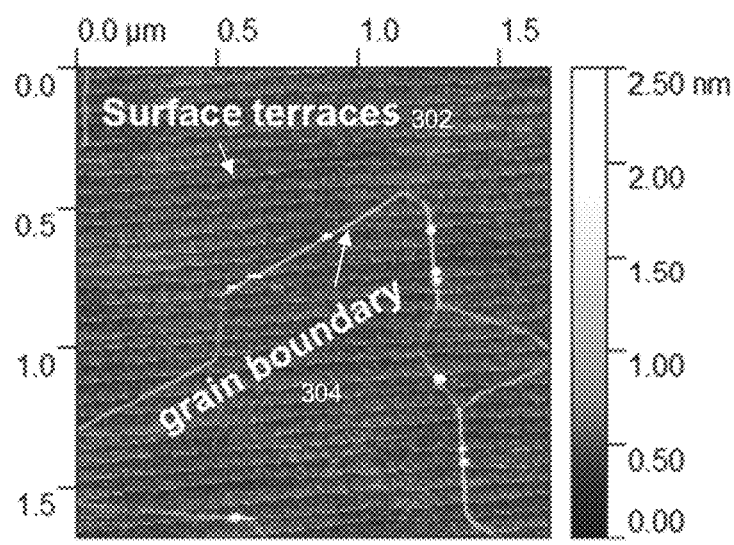
FIG. 3
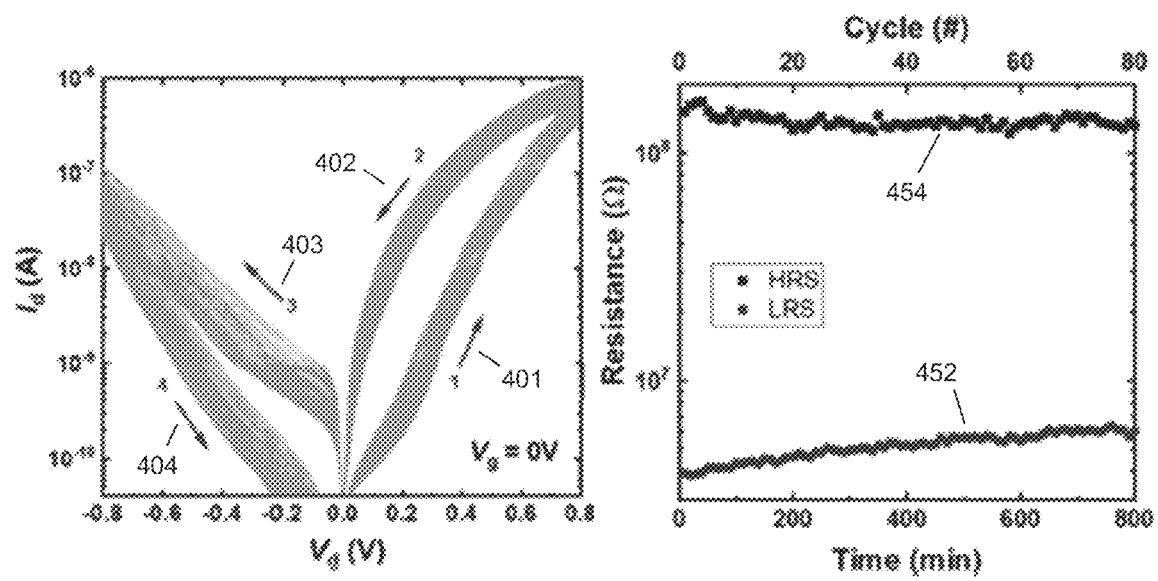
FIG. 4A
FIG. 4B

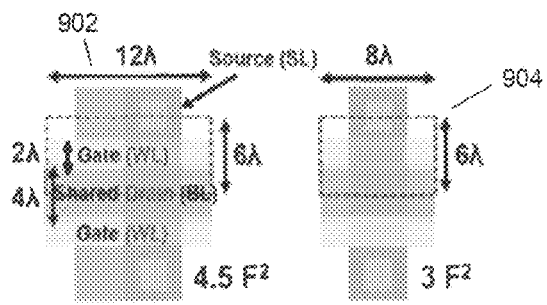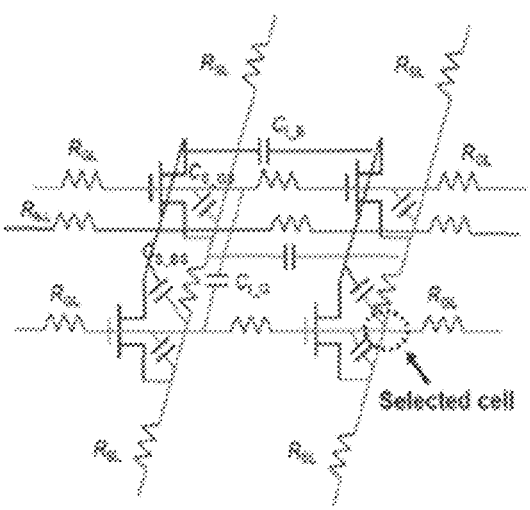
FIG. 9A | FIG. 9B
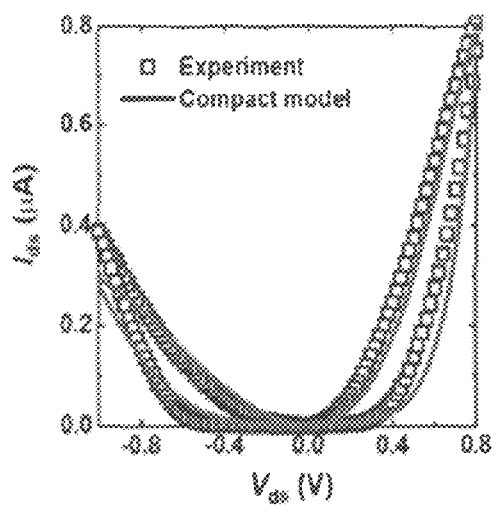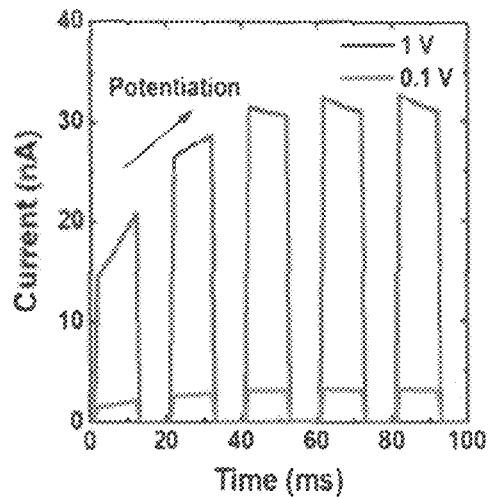
FIG. 9C | FIG. 9D
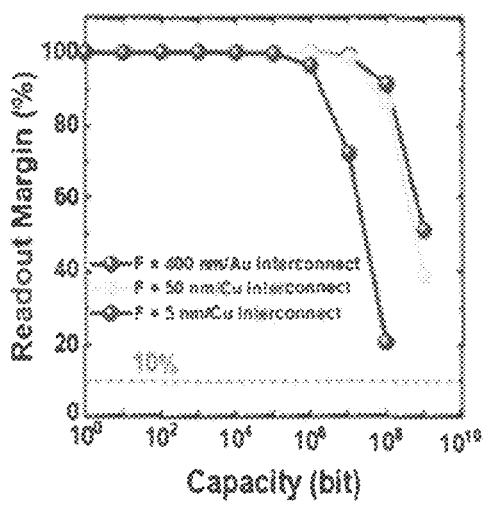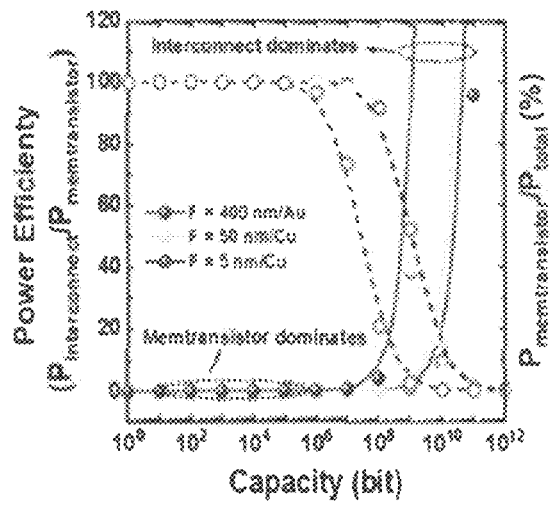
FIG. 9E | FIG. 9F

SELF-SELECTIVE MULTI-TERMINAL MEMTRANSISTOR FOR CROSSBAR ARRAY CIRCUITS

CROSS-REFERENCE TO RELATED APPLICATION

This application claims the benefit of Singapore Patent Application No. 10202011172S, filed on 10 Nov. 2020. The entire contents of which is incorporated herein by reference.

FIELD OF THE INVENTION

This invention relates to a self-selective multi-terminal memtransistor suitable for use in crossbar array circuits. In particular, the memtransistor comprises a sapphire substrate that has a single-layer of polycrystalline molybdenum disulphide ($MoS_2$) thin film formed on the surface of the substrate, wherein the $MoS_2$ thin film comprise $MoS_2$ grains that are oriented along terraces provided on the surface of the substrate. The memtransistor has a drain electrode and a source electrode that is formed on the $MoS_2$ thin film such that a channel is defined in the $MoS_2$ thin film between the drain and source electrodes, and a gate electrode formed above the channel, whereby the gate electrode is isolated from the channel by a gate dielectric layer.

SUMMARY OF THE PRIOR ART

The application of artificial intelligence (AI) technology in tasks that require perception (e.g., computer vision, speech recognition) and Internet-of-Things (IoT) places significant demands on computing speed and power efficiency. However, the conventional von Neumann architecture which physically separates the processing and memory units presently suffers from a fundamental limitation in its data rate and energy consumption due to the enormous movement of data between both subsystems.

To address this limitation and to push the envelope for energy efficiency, a radically different computing paradigm that allows in situ computation within the memory, or in-memory computing, is required. This new computing paradigm allows the issues associated with data-abundant computing, as driven by AI, to be addressed. For example, various types of crossbar array circuits have been constructed using non-volatile memories (NVMs) such as two-terminal resistive random access memory (RRAM), phase change memory (PCM) or three-terminal flash memory, ferroelectric field-effect transistors (FeFET), and etc. to realize artificial neural networks that are able to perform image classification workloads.

Among the above-mentioned crossbar array circuit configurations, the 1-RRAM (1-R) circuit configuration is the simplest circuit wherein a two-terminal RRAM is sandwiched between bit lines (BLs) and word lines (WLs). This provides excellent area efficiency and allows for very high density integration. However, the high sneak current that flows through the neighbouring memory cells remains a fundamental issue. Such an issue may be mitigated by engineering the memristor to have a high I-V nonlinearity or by adding a rectifying selector to each cell (1S-1R). However, this limits the size of the array as the performance requirement for the memristor and selector is very demanding.

To further reduce sneak current and to enable accurate programming/reading in a large-scale crossbar array, the one transistor one-resistor (1T-1R) architecture has been the most widely studied configuration whereby a selector transistor is integrated into each cell. The third-terminal (gate) in the transistor offers better controllability even though this structure suffers from larger circuit overheads (e.g., area, power) and complex fabrication processes which detrimentally compromises the integration density.

Therefore, the three terminal unit cell is more desirable due to its ability to combine resistive switching (RS) and the selection function into a single device without any penalty in its footprint. Some three-terminal unit cells, such as flash memory and FeFET have been investigated and they are found to achieve a more linear and symmetric electrostatic gate control. The non-volatile RS behaviour is represented by the device threshold voltage and the subsequent drain current modulation is achieved by gate voltage induced charge-trapping or ferroelectric polarization. Thus, despite being a three-terminal device, the gate control is still not able to provide the required additional selection function to avoid crosstalk issues from occurring between neighbouring cells.

To address these problems, those skilled in the art have proposed that a memtransistor be used. The memtransistor is essentially a hybrid integration of a memristor and a transistor, and combines the RS and selection functions into a single device structure.

Recently, those skilled in the art have developed multi-terminal memtransistors using single-layer polycrystalline molybdenum disulfide ($MoS_2$) thin film grown using chemical vapor deposition (CVD). The memtransistor is configured in a field-effect transistor (FET) structure wherein the RS behaviour is mainly programmed by the memtransistor's drain voltage based on grain-boundary-mediated defects migration, while the gate terminal offers controllability over sneak current by enabling unselected cells to be turned off. Moreover, the $MoS_2$ memtransistor is capable of implementing synaptic plasticity, making it a potential building block to realize artificial neural network (ANN) for in-memory computing. Based on this, a dual-gate memtransistor crossbar array was recently demonstrated whereby each memtransistor's top-gate and bottom-gate could be independently controlled. To program each individual memtransistor, a drain voltage of 20 Volts was applied to the selected bit line with a global back-gate voltage of −60 Volts and a selected word line (top-gate) voltage of 10 Volts. Based on these values, it can be seen that this circuit design and configuration consumes a significant amount of power. Moreover, in order to achieve the desired result, a high-k gate dielectric was used and post-growth defect engineering using helium-ion irradiation was employed. Even though these steps were taken, the switching energy of the proposed circuit design was still much larger than Nano-Joules and as a result, this design was unable to meet the low-power consumption requirement of in memory computing.

For those reasons, those skilled in the art are constantly striving to come up with ways to design a multi-terminal memtransistor that may be utilized in a crossbar array circuit whereby each transistor can be independently gate controlled, has minimal sneak current between each memtransistor in the circuit and whereby each memtransistor has a low switching energy requirement.

SUMMARY OF THE INVENTION

The above and other problems are solved and an advance in the art is made by systems and methods provided by embodiments in accordance with the invention.

A first advantage of embodiments of a device and circuit in accordance with the invention is that in operation, the memtransistor does not consume a lot of power as it has a low switching voltage of about 0.42 Volts and a switching energy of about 20 fJoules/bit.

A second advantage of embodiments of a device and circuit in accordance with the invention is that the memtransistors may be independently controlled by varying the voltage applied to the gate terminal of the memtransistor.

A third advantage of embodiments of a device and circuit in accordance with the invention is that the sneak current between adjacent memtransistors in the crossbar array is minimized, to less than 0.1 Nano-Amperes.

A fourth advantage of embodiments of a device and circuit in accordance with the invention is that when the gate terminals of each memtransistor in the same row are connected to form word lines in the crossbar array circuit, these gate terminals serve as natural selectors to enable multibit data storage, suppress sneak path leakage current and realize linear and symmetric synaptic weight updating.

A fifth advantage of embodiments of a circuit in accordance with the invention is that the circuit architecture is capable of performing multiply-and-accumulate operations to solve data-centric tasks in pattern recognition, which could be extended to other AI-driven applications such as speech recognition, autonomous vehicles, among others.

A sixth advantage of embodiments of a device in accordance with the invention is that through the use of a three-terminal architecture that has an electrostatic gate effect, this provides an additional knob to effectively suppress sneak current, enable a linear and symmetry synaptic plasticity, and a practical readout margin for gigabit-scale integration.

According to a first aspect of the invention, a memtransistor is disclosed whereby the memtransistor comprises a sapphire substrate having a plurality of well-defined smooth terraces formed on a surface of the substrate; a single-layer polycrystalline molybdenum disulphide ($MoS_2$) thin film formed on the surface of the substrate, wherein the $MoS_2$ thin film comprise $MoS_2$ grains oriented along the terraces of the surface; a drain electrode and a source electrode formed on the $MoS_2$ thin film such that a channel is defined in the $MoS_2$ thin film between the drain and source electrodes, wherein grain boundaries formed by the $MoS_2$ grains in the channel are aligned parallel to a direction of current flow between the drain and source electrodes; a gate dielectric layer formed over the $MoS_2$ thin film, the drain and source electrodes; and a gate electrode formed above the channel, over the gate dielectric layer.

In accordance with the first aspect of the invention, the alignment of the grain boundaries in the $MoS_2$ thin film enable the memtransistor to have a low switching voltage between 0.4 and 0.7 Volts and a low switching energy between 10 and 10 femtojoule/bit by making grain boundary facilitated S vacancy movements more favourable to be triggered.

In accordance with the first aspect of the invention, the memtransistor is fabricated in a three-terminal field-effect-transistor geometry.

In accordance with the first aspect of the invention, the well-defined smooth terraces are formed on the surface of the substrate by annealing the substrate in air at a temperature range between 900° C. and 1200° C.

In accordance with the first aspect of the invention, the $MoS_2$ thin film is formed on the surface of the substrate via a chemical vapour deposition (CVD) process using molybdenum trioxide ($MoO_3$) powder, sulfur powder and a nickel foam block configured as a sulfur vapour scavenger.

A crossbar array circuit comprising a first and a second memtransistor according to the memtransistor described in accordance with the first aspect of the invention is disclosed, whereby in this circuit, drain electrodes of the first and second memtransistors are electrically connected to a first bit line terminal, a gate electrode of the first memtransistor is electrically connected to a first gate terminal, a gate electrode of the second memtransistor is electrically connected to a second gate terminal, and source electrodes of the first and second memtransistors are electrically connected to a first source line terminal.

In accordance with the first aspect of the invention, the crossbar array circuit further comprising a third and a fourth memtransistor described in accordance with the first aspect of the invention is disclosed whereby in this circuit, drain electrodes of the third and fourth memtransistors are electrically connected to the first bit line terminal, a gate electrode of the third memtransistor is electrically connected to the first gate terminal, a gate electrode of the fourth memtransistor is electrically connected to the second gate terminal, and source electrodes of the third and fourth memtransistors are electrically connected together to a second source line terminal.

In accordance with the first aspect of the invention, the crossbar array circuit further comprising a fifth and a sixth memtransistor described in accordance with the first aspect of the invention is disclosed whereby in this circuit, drain electrodes of the fifth and sixth memtransistors are electrically connected to a second bit line terminal, gate electrodes of the fifth and sixth memtransistors are electrically connected to a third gate terminal, a source electrode of the fifth memtransistor is electrically connected to a third source line terminal, and a source electrode of the sixth memtransistor is electrically connected to a fourth source line terminal.

In accordance with the first aspect of the invention, it is disclosed that a memtransistor from the crossbar array circuit is selected by applying a set voltage $V_{set}$ to a drain electrode of the selected memtransistor, a ground or a positive bias voltage to a gate electrode of the selected memtransistor and switching on an access transistor electrically connected to a source electrode of the selected memtransistor.

In accordance with the first aspect of the invention, it is disclosed that a memtransistor from the crossbar array circuit is unselected by applying a floating or a negative bias voltage to a gate electrode of the unselected memtransistor and switching off an access transistor electrically connected to a source electrode of the unselected memtransistor.

According to a second aspect of the invention, a method for fabricating a memtransistor is disclosed, the method comprising the steps of forming a plurality of well-defined smooth terraces on a surface of a sapphire substrate; forming a single-layer polycrystalline molybdenum disulphide ($MoS_2$) thin film on the surface of the substrate, wherein the $MoS_2$ thin film comprise $MoS_2$ grains oriented along the terraces of the surface; forming a drain electrode and a source electrode on the $MoS_2$ thin film such that a channel is defined in the $MoS_2$ thin film between the drain and source electrodes, wherein grain boundaries formed by the $MoS_2$ grains in the channel are aligned parallel to a direction of current flow between the drain and source electrodes; forming a gate dielectric layer over the $MoS_2$ thin film, the drain and source electrodes; and forming a gate electrode over the gate dielectric layer such that the gate electrode is above the channel.

In accordance with the second aspect of the invention, the alignment of the grain boundaries in the $MoS_2$ thin film enable the memtransistor to have a low switching voltage between 0.4 and 0.7 Volts and a low switching energy between 10 and 10 femtojoule/bit by making grain boundary facilitated S vacancy movements more favourable to be triggered.

In accordance with the second aspect of the invention, the memtransistor is fabricated in a three-terminal field-effect-transistor geometry.

In accordance with the second aspect of the invention, the forming of the well-defined smooth terraces on the surface of the substrate comprises the step of annealing the substrate in air at a temperature range between 900° C. and 1200° C.

In accordance with the second aspect of the invention, the forming of the $MoS_2$ thin film on the surface of the substrate comprises utilizing a chemical vapour deposition (CVD) process using molybdenum trioxide ($MoO_3$) powder and sulfur powder to form the $MoS_2$ thin film, whereby a nickel foam block configured as a sulfur vapour scavenger is provided between the molybdenum trioxide ($MoO_3$) powder and the substrate.

In accordance with the second aspect of the invention, a crossbar array circuit comprising a first and a second memtransistor formed according to the method described by the second aspect of the invention comprises drain electrodes of the first and second memtransistors are electrically connected to a first bit line terminal, a gate electrode of the first memtransistor is electrically connected to a first gate terminal, a gate electrode of the second memtransistor is electrically connected to a second gate terminal, and source electrodes of the first and second memtransistors are electrically connected to a first source line terminal.

In accordance with the second aspect of the invention, the crossbar array circuit further comprising a third and a fourth memtransistor formed according to the method of the second aspect of the invention is disclosed whereby in this circuit, drain electrodes of the third and fourth memtransistors are electrically connected to the first bit line terminal, a gate electrode of the third memtransistor is electrically connected to the first gate terminal, a gate electrode of the fourth memtransistor is electrically connected to the second gate terminal, and source electrodes of the third and fourth memtransistors are electrically connected together to a second source line terminal.

In accordance with the second aspect of the invention, the crossbar array circuit further comprising a fifth and a sixth memtransistor formed according to the method of the second aspect of the invention is disclosed, whereby in this circuit, drain electrodes of the fifth and sixth memtransistors are electrically connected to a second bit line terminal, gate electrodes of the fifth and sixth memtransistors are electrically connected to a third gate terminal, a source electrode of the fifth memtransistor is electrically connected to a third source line terminal, and a source electrode of the sixth memtransistor is electrically connected to a fourth source line terminal.

In accordance with the second aspect of the invention, it is disclosed that a memtransistor from the crossbar array circuit is selected by applying a set voltage $V_{set}$ to a drain electrode of the selected memtransistor, a ground or a positive bias voltage to a gate electrode of the selected memtransistor and switching on an access transistor electrically connected to a source electrode of the selected memtransistor.

In accordance with the second aspect of the invention, it is disclosed that a memtransistor from the crossbar array circuit is unselected by applying a floating or a negative bias voltage to a gate electrode of the unselected memtransistor and switching off an access transistor electrically connected to a source electrode of the unselected memtransistor.

BRIEF DESCRIPTION OF THE DRAWINGS

The above advantages and features in accordance with this invention are described in the following detailed description and are shown in the following drawings:

FIG. 3 illustrating terraces formed on a surface of a sapphire substrate in accordance with embodiments of the invention;

FIG. 4A illustrating plots of drain-source current (Ids) against drain-source voltage (Vds) of a single memtransistor when the gate is grounded, with arrows showing the sweep directions of Vds to illustrate the non-volatile RS behaviour of the memtransistor in accordance with embodiments of the invention;

FIG. 4B illustrating the retention behaviour of the high resistance state (HRS) and low resistance state (LRS) over a duration of 800 minutes for a memtransistor designed in accordance with embodiments of the invention;

FIG. 9 illustrating compact modelling and circuit simulations whereby

FIG. 9A illustrating a layout of a shared bit line (BL) structure,

FIG. 9B illustrates a circuit diagram of memtransistor crossbar array with parasitic resistance and capacitance, FIG. 9C illustrates simulated Ids-Vds from compact model vs. a measured $MoS_2$ memtransistor, FIG. 9D illustrates dynamic response of long-term potentiation behaviour based on a compact model, FIG. 9E illustrates readout margin for three different wire resistances as simulated by SPICE model, and FIG. 9F illustrates simulated power efficiency with the three interconnection schemes shown in FIG. 9E;

DETAILED DESCRIPTION

This invention relates to a self-selective multi-terminal memtransistor suitable for use in crossbar array circuits. In particular, the memtransistor comprises a sapphire substrate that has a single-layer of polycrystalline molybdenum disulphide ($MoS_2$) thin film formed on the surface of the substrate, wherein the $MoS_2$ thin film comprise $MoS_2$ grains that are oriented along terraces provided on the surface of the substrate. The memtransistor has a drain electrode and a source electrode that is formed on the $MoS_2$ thin film such that a channel is defined in the $MoS_2$ thin film between the drain and source electrodes, and a gate electrode formed above the channel, whereby the gate electrode is isolated from the channel by a gate dielectric layer. The grain boundaries formed by the $MoS_2$ grains in the channel are aligned parallel to a direction of current flow between the drain and source electrodes.

One skilled in the art will recognize that all terms used herein have the same meaning as commonly understood by one skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Further, one skilled in the art will also recognize that terms used throughout specification such as, but not limited, "approximately", "about", "substantially" or "around" shall generally mean within 20 percent, preferably within 10 percent, and more preferably within 5 percent of a given value or range.

Figure 1:
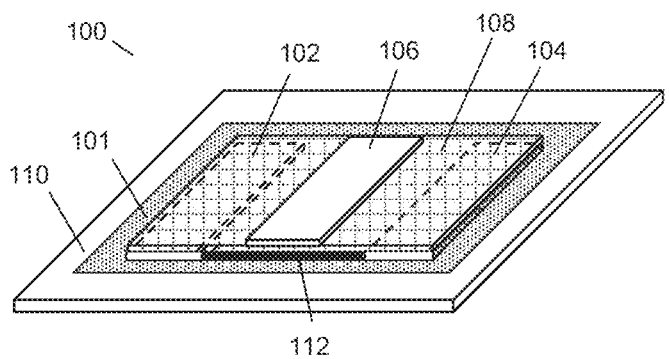
FIG. 1 illustrating a structure of the memtransistor in accordance with embodiments of the invention.

FIG. 1 illustrates a structure of memtransistor 100 in accordance with embodiments of the invention. In particular, memtransistor 100 comprises of a sapphire substrate 110 that has a plurality of well-defined smooth terraces formed on a surface of the substrate (see FIG. 3); a single-layer polycrystalline molybdenum disulphide ($MoS_2$) thin film 101 formed on a surface of substrate 110; a source electrode 102 and a drain electrode 104 formed on the $MoS_2$ thin film 101 such that a channel 112 is defined in the $MoS_2$ thin film between these two electrodes; a gate dielectric layer 108 covering the source electrode 102, the drain electrode 104 and the $MoS_2$ thin film 101; and a gate electrode 106 formed on the gate dielectric layer 108—directly above channel 112.

In accordance with an embodiment of the invention, a plurality of well-defined terraces are formed on a surface of the sapphire substrate 110. The sapphire substrate may comprise, but is not limited to, a c-plane (0001) sapphire substrate. The main function of these terraces is to promote the growth of epitaxial $MoS_2$ grains on the c-plane sapphire substrate 110. In embodiments of the invention, these well-defined terraces may be formed by annealing the sapphire substrate 110 in air at a temperature between 1000° C. and 1200° C. for around one hour, preferably at 1000° C. for one hour. A scanned image showing the formation of these terraces on the surface of sapphire substrate 110 is illustrated in FIG. 3. In particular, FIG. 3 shows surface terraces 302 that were formed due to the annealing of the sapphire substrate.

Once the well-defined terraces have been formed on the surface of sapphire substrate 110, monolayer poly-$MoS_2$ layers are formed on the sapphire substrate 110 through a chemical vapour deposition (CVD) process whereby molybdenum trioxide ($MoO_3$) powders are used as a molybdenum (Mo) precursor and sulfur (S) powders are used as the S precursor in a two-zone CVD reactor. The exact details of the two-zone CVD reactor process is omitted for brevity as this process is well known to one skilled in the art.

In an embodiment of the invention, thin nickel (Ni) (or nickel oxide (NiO))-foam was used as a sulfur vapour scavenger (or a S-vapor trap) to suppress the $MoO_3$ powder from poisoning the sapphire substrate and this is achieved by placing the sulfur vapour scavenger adjacent the $MoO_3$ precursor, or by placing the sulfur vapour scavenger together with the $MoO_3$ precursor inside a closed cylindrical tube or by placing the sulfur vapour scavenger on top of a crucible boat containing $MoO_3$ powder.

In an exemplary embodiment of the invention, the monolayer polycrystalline $MoS_2$ was grown on sapphire substrate 110 in a two zone CVD furnace whereby 1.5 g sulfur (99.998%, Sigma-Aldrich) was positioned in the upstream zone at 150° C. and 3.5 mg $MoO_3$ (99.98%, Sigma-Aldrich) was positioned in the downstream zone at 750° C. with an Argon (Ar) gas flow of 50 sccm. The growth process was done with the entirety of the tube maintained at a pressure of 6 Torr. The temperatures at both zones were then maintained for 10 minutes. Both zones were then allowed to cool naturally down to 600° C. before the furnace hatches were opened for rapid natural cooling. In this setup, $MoO_3$ and S powders were placed 30 cm apart and the $MoO_3$ powder was placed in a single open-end crucible with a piece of nickel foam (sized 3 cm×3 cm, 1 mm thickness with 400 μm average pore size) placed directly above the $MoO_3$ powder. The sapphire substrate was then placed above the foam, supported by pieces of ceramic. It should be noted that in this embodiment, the substrate comprised a commercially bought c-plane (0001) sapphire ($Al_2O_3$) substrate (Namiki Inc.) that has been annealed in air at 1100° C. for 1 hour.

With reference to FIG. 1, it can be seen that once the $MoS_2$ thin film 101 has been formed on the sapphire substrate 110 in accordance with embodiments of the invention, source electrode 102 and drain electrode 104 are then formed on the $MoS_2$ thin film 101 such that a channel 112 is defined in the $MoS_2$ thin film between these two electrodes. The grain boundaries formed by the $MoS_2$ grains in the channel are aligned parallel to a direction of current flow between the drain and source electrodes. This can be seen in FIG. 3 whereby the growth of grain boundaries 304 on the $MoS_2$ film were encouraged due to the presence of the well-defined terraces 302 on the surface of the sapphire substrate.

With reference to FIG. 1, a gate dielectric layer 108, which may comprise of, but is not limited to, aluminium oxide ($Al_2O_3$) is then formed over the present structure, covering the source electrode 102, the drain electrode 104, the $MoS_2$ thin film 101, and the channel 112. A gate electrode 106 is then formed on the gate dielectric layer 108—directly above channel 112 thereby completing the structure of memtransistor 100.

Figure 2:
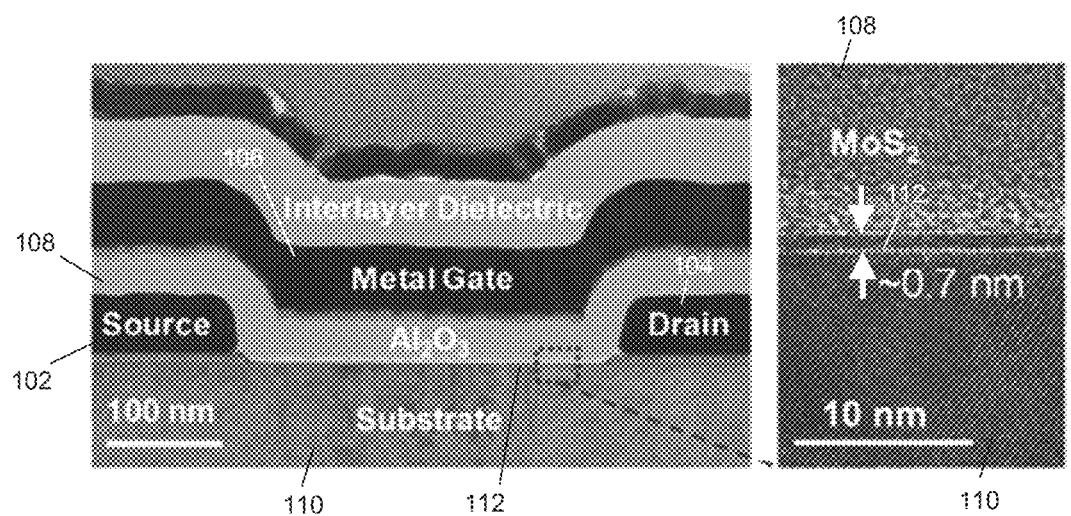
FIG. 2 illustrating a cross-sectional traverse electron microscope (TEM) image of the memtransistor in accordance with embodiments of the invention.

FIG. 2 illustrates a cross-sectional traverse electron microscope (TEM) image of memtransistor 100 that was fabricated in accordance with embodiments of the invention. The TEM image of memtransistor 100 shows that memtransistor 100 has the geometry of a three-terminal field-effect-transistor. The zoomed-in view of the $MoS_2$ channel region 112 reveals the monolayer of the $MoS_2$ channel material when a scale bar of 10 nm was used. It can be seen that the $MoS_2$ channel has a uniformed thickness down to a monolayer of 0.7 nm, which exemplifies the ultimate scalability of memtransistor 100.

FIG. 4A shows the characterization of RS behaviour of a memtransistor 100 in accordance with embodiments of the invention when 150 consecutive Ids-Vds (drain-source current–drain-source voltage) sweeps along the directions shown by the arrows 401, 402, 403 and 404 were applied to memtransistor 100, and when the gate terminal was grounded. From the plots in FIG. 4A, it can be seen that memtransistor 100 exhibits evident bipolar non-volatile switching. The cumulative probability plot of the high resistance state (HRS) and low resistance state (LRS) at a reading voltage of 0.2 V shows a low temporal (cycle-to-cycle) variation. With a defined set current of $10^{-8}$ A or $10^{-7}$ A, it was found that the memtransistor shows a low average switching voltage between 0.42 and 0.62 Volts, respectively, which is two-orders of magnitude smaller than previous works, and low switching energy between 10 and 30 fJ/bit and this is critical in the realization of energy-efficient in-memory computing.

It was determined that the low switching voltage of 0.42 Volts and low switching energy of 20 fJ/bit was achieved due to the epitaxial $MoS_2$ growth with orientated grains along the surface terraces of the sapphire substrate. In particular, the low switching energy was promoted by the oriented grains in the poly-$MoS_2$ channel. Still more particularly, the grain boundaries (GBs)-facilitate sulfur (S) vacancy movement along the channel. This gives rise to defect profile redistribution, which accounts for the resistance switching behaviour in the $MoS_2$ memtransistor. Thus, oriented grains bridging the source and drain, and parallel to the direction of current makes the movement of S vacancy more favourable to be triggered and this accounts for the low switching energy of the $MoS_2$ memtransistor.

The HRS/LRS ratio read at 0.2 V remains intact through 800 minute cycling measurements, implying a long-term non-volatility as shown in FIG. 4B where plot 454 shows the HRS plots and plot 452 shows the LRS plots. During these cycling measurements, 80 cycles are performed with an interval of 10 min per cycle, as shown in the top X-axis. In contrast to two-terminal RRAM, the memtransistor offers an extra flexibility in deploying both drain and gate terminals to effectively tune the conductance (synaptic weight). The charge accumulation under large Vds (drain-source voltage) and positive gate voltage then causes an increase in channel conductance accordingly.

Figure 5:
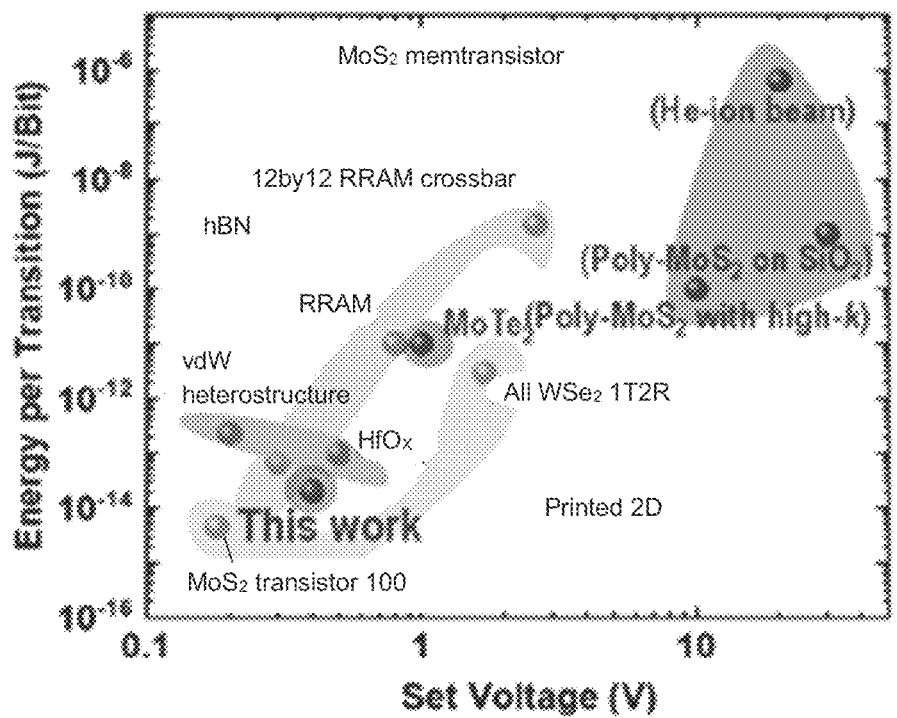
FIG. 5 illustrating a benchmarking plot comparing the switching energy per bit against the switching voltage of the $MoS_2$ memtransistor designed in accordance with embodiments of the invention with other similar non-volatile resistance switching devices.

FIG. 5 illustrates a benchmarking plot comparing the switching energy per bit against the switching voltage of the $MoS_2$ memtransistor designed in accordance with embodiments of the invention with other similar non-volatile resistance switching devices such as printed electronics (comprising $MoS_2$ RRAM crossbar and all $WSe_2$ 1T-1R), hexagonal boron nitride (hBN) (e.g. 1-R crossbar array, synaptic RRAM, and van der Waals (vdW) heterostructure synapse), hafnium oxide ($HfO_x$) RRAM, and standalone $MoS_2$ memtransistor (back-gate configuration, top-gate configuration, and He-ion beam treated channel). Overall, from this benchmarking plot, it can be seen that memtransistor 100 possesses one of the lowest set voltage and switching energy (20 fJ/bit) as benchmarked with previously reported $MoS_2$ memtransistors, 2 DMs (hBN, $WSe_2$, $MoTe_2$, et al.) and transition metal oxide-based memristors.

Figure 6:
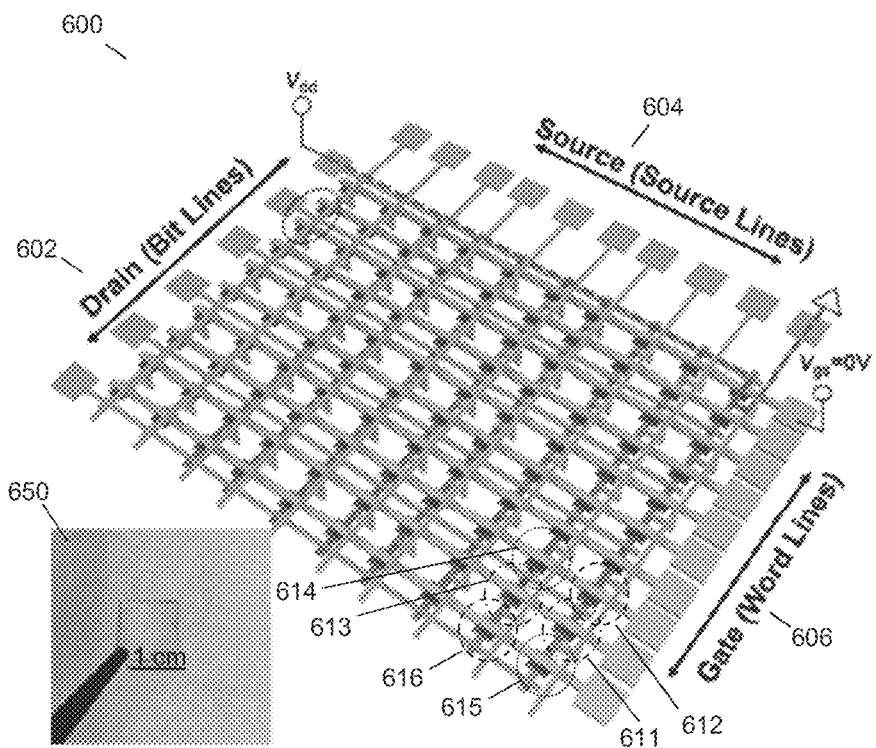
FIG. 6 illustrating a circuit diagram of a multi-terminal memtransistor crossbar array circuit in accordance with embodiments of the invention.

In embodiments of the invention, a plurality of memtransistor 100s may be configured in a crossbar array circuit arrangement as illustrated in FIG. 6.

In a first embodiment of the crossbar array circuit, the crossbar array circuit may comprise of a first 611 and a second 612 memtransistor whereby each memtransistor has the same structure as memtransistor 100. The drain electrodes of the first 611 and second 612 memtransistors may be electrically connected to a first bit line terminal, a gate electrode of the first 611 memtransistor may be electrically connected to a first gate terminal, a gate electrode of the second 612 memtransistor may be electrically connected to a second gate terminal, and the source electrodes of the first 611 and second 612 memtransistors may be electrically connected to a first source line terminal.

In a second embodiment of the crossbar array circuit, in addition to the circuit comprising the first 611 and second 612 memtransistors, the circuit may further comprise a third 613 and a fourth 614 memtransistor whereby each memtransistor has the same structure as memtransistor 100. The drain electrodes of the third 613 and fourth 614 memtransistors may be electrically connected to the first bit line terminal, a gate electrode of the third 613 memtransistor may be electrically connected to the first gate terminal, a gate electrode of the fourth 614 memtransistor may be electrically connected to the second gate terminal, and source electrodes of the third 613 and fourth 614 memtransistors may be electrically connected together to a second source line terminal.

In a third embodiment of the crossbar array circuit, the circuit may comprise a fifth 615 and a sixth 616 memtransistor whereby each memtransistor has the same structure as memtransistor 100. The drain electrodes of the fifth 615 and sixth 616 memtransistors may be electrically connected to a second bit line terminal, gate electrodes of the fifth 615 and sixth 616 memtransistors may be electrically connected to a third gate terminal, a source electrode of the fifth 615 memtransistor may be electrically connected to a third source line terminal, and a source electrode of the sixth 616 memtransistor may be electrically connected to a fourth source line terminal.

One skilled in the art will recognize that the first, second and third embodiments of the crossbar array circuit may be combined together as required without departing from the invention. FIG. 6 illustrates a three-dimensional schematic of a 10×10 $MoS_2$ crossbar array 600 made up of memtransistors 100. As shown, it can be seen that the drain/gate terminals of memtransistors in the same row are connected to form the bit lines (BLs) 602/word lines (WLs) 606. The source lines (SLs) 604 connect the source terminals of the memtransistors in the same column together, which run vertically to the BLs/WLs in a separated layer. An access transistor connects each BL/WL/SL in the peripheral circuits outside the array. When the memtransistor cells are to be set in crossbar array 600, the selected BL from BL 602 is applied with a voltage Vset and the selected WL from WL 606 is grounded or positive biased (since the memtransistor shows a n-type behaviour). The access transistor on the selected source line (SL) from SL 604 is then turned on to collect the current. The unselected SLs are switched off by the access transistor and the unselected WLs are floated or applied with negative voltages such that there are no currents flowing through those unselected memtransistors. Image 650 shows an exemplary as-fabricated crossbar array on sapphire substrate with dimensions 1×1 cm$^2$.

Figure 7:
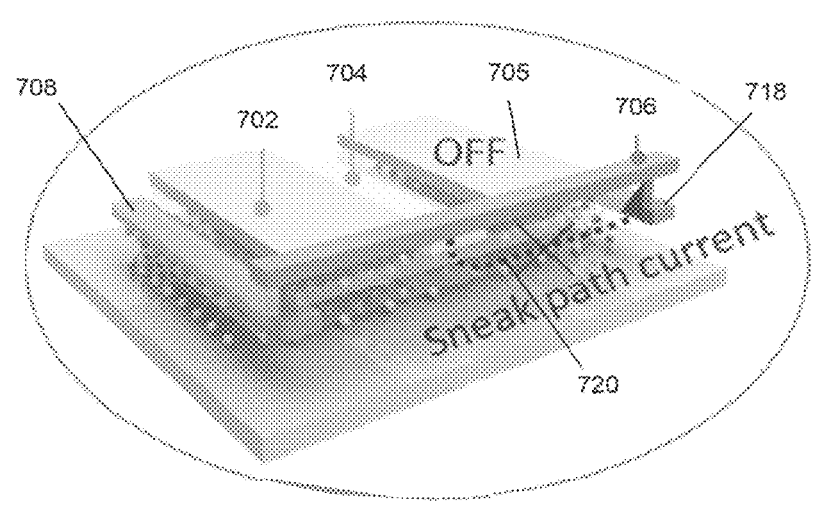
FIG. 7 illustrating a 3D schematic diagram of a two adjacent memtransistors in a crossbar array circuit in accordance with embodiments of the invention.

FIG. 7 illustrates a magnified schematic of two neighbouring memtransistors, first and second memtransistor (i.e. cells), in crossbar array 600. It can be seen that the first memtransistor comprises of source terminal 708, gate terminal 702 and drain terminal 704, which is shared with the second memtransistor which further comprises gate terminal 705 and source terminal 718, whereby the source terminals are connected to a single source line 706.

Figure 8:
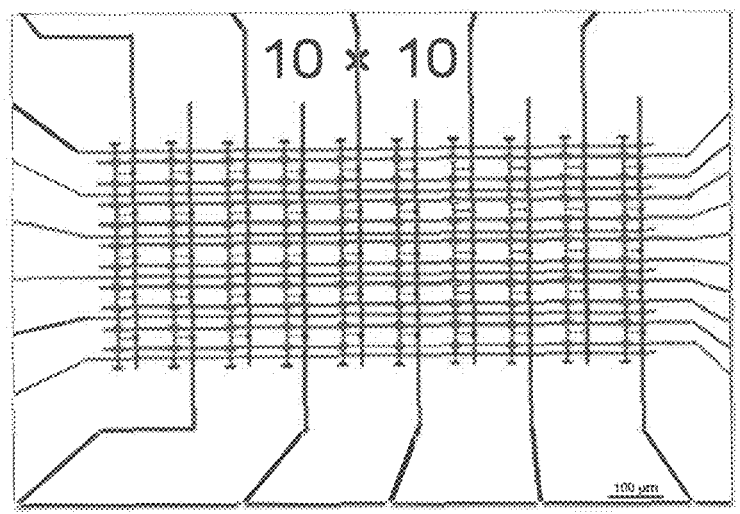
FIG. 8 illustrating a top view of a fabricated crossbar array circuit in accordance with embodiments of the invention.

When the drain terminals are shared between neighbouring cells in crossbar array 600, this effectively reduces the number of BL to (M/2+1) in an M row×N column crossbar array. The architecture of crossbar array circuit 600 allows the memtransistors to be independently accessed with a linear I-V relation under the gate control, so that each memtransistor's conductance can be precisely tuned in an analogue manner. During the setting of the conductance states of the selected cells, the selected WLs that correspond to the gate terminals of the selected cells are grounded or positive biased while all of the unselected WLs are floated or negatively biased to completely deplete the carriers in the channel to avoid sneak current 720 from occurring. At the same time, the selected SLs are turned on to collect the current while the remaining unselected SLs are turned off by the access transistors to further avoid sneak current flowing through those unselected memtransistor cells. By doing so, it was found that the sneak current was minimized to be less than 0.1 nA. FIG. 8 illustrates a microscopic top-view image of the as-fabricated 10×10 MoS$_2$ memtransistor crossbar array.

With the insatiable need for increasing memory integration capacity, the voltage drop that occurs along the interconnection gradually reduces the voltage available to drive the memtransistor. In order to evaluate the circuit performance, the material-device-circuit co-design was investigated with respect to the memtransistor device's behaviour, physical layout, parasitic effect, and interconnect properties (readout margin and power efficiency) when the integration capacity was increased.

The physical layout was first analysed using a λ-based design rule with the feature size F=4λ, =the minimum half-pitch. Schematic 902 as illustrated in FIG. 9A shows a shared-drain layout adopted, which has a cell size of 4.5 F$^2$. Such a cell size is comparable to existing 1-R structures (4 F$^2$), but is much smaller than the all tungsten diselenide (WSe$_2$) 1T-1R structure (7 F$^2$) and the SRAM structure (120-150 F$^2$). To further reduce the cell size, an even more compact structure is proposed in schematic 904. In schematic 904, it was proposed that the SLs could be fabricated directly on top of the isolation oxide. This compact architecture could further reduce the cell size to 3 F$^2$. By co-integrating the transistor and memristor into a compact memtransistor cell, this would enable dense on-chip monolithic integration with CMOS logic. The crossbar array is further built by assembling cells into an interconnected network.

FIG. 9B shows the proposed cell model which includes the wire resistance of BLs/WLs/SLs, the coupling capacitance between two neighbouring wires and the stray capacitance between the interconnect wires and the reference plan (source line). To describe the RS behaviour, a surface potential-based physical compact model for the memtransistor was utilized. The RS behaviour is described by the correlation between the dynamics of the total defect/trap density and the grain boundary energy barrier (Eb). It was developed on the basis of traditional transport theory in poly material which incorporates grain size dependence. The transient and dynamic compact model behaviour has been calibrated against experimental results to validate the model, as shown in FIGS. 9C and 9D. The performance of the memtransistor crossbar array is then evaluated by HSPICE with an increase in the integration capacity.

In the scenario wherein the selected cell is located at the corner furthest from the BL voltage source and the ground, as shown in FIG. 9B, the voltage drop caused by the BL resistance is the largest. The readout margin and power efficiency are simulated under three process feature size: (1) F=400 nm for gold interconnect used, (2) F=50 nm for Cu interconnect used by industry today, and (3) F=5 nm as projected by ITRS. The readout margin is defined as the voltage imposed to the selected cell under the worst-case scenario over the input voltage, as shown in FIG. 9E, which evaluates the voltage drop over the interconnect. It is shown that almost 100% voltage is delivered up to megabit-scale (10$^6$) capacity for all three different types of wire. The vector matrix multiplication (VMM) operation would be accurate when the interconnect resistance is negligible compared with the memtransistor resistances. The 10% readout margin criterion can support a gigabit-scale (10$^9$) memtransistor crossbar array using today's Cu interconnect technology with a 50 nm feature size.

FIG. 9F demonstrates the power efficiency of the interconnection over memtransistor and the memtransistor over the whole circuit. It is shown that as the integration capacity increases, the power consumption induced by interconnect would become a dominant limiting factor. Overall, the results indicate that the need for having a low interconnection resistance is becoming increasingly nontrivial. These results clearly show the benefits of employing memtransistor crossbar array in simplifying the fabrication process and potentially enabling compatibility with high-volume CMOS manufacturing.

Multiply-and-Accumulate Operation

Figure 10A:
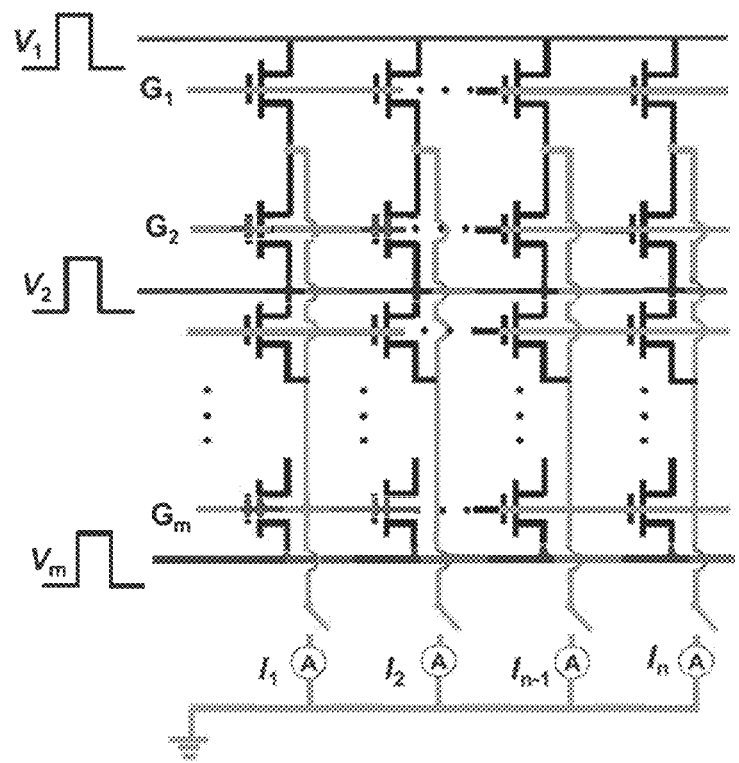
FIG. 10A illustrating a circuit diagram of the $MoS_2$ memtransistor crossbar array circuit and FIG. 10B illustrating the measured and arithmetic currents at a high resistance state (HRS)

Mathematically, in-memory computing may be decomposed into a series of multiply-and-accumulate operations that can be implemented using the memtransistor crossbar array architecture. The equivalent circuit diagram and the vector dot product process is shown in FIG. 10A. In the illustrated circuit, the input signal (encoded as the applied voltage to the BLs) is multiplied with the corresponding weight element (encoded as conductance states of the memtransistor), and by utilizing Ohm's law for multiplication and Kirchhoff's laws for accumulation, the weighted sum can be obtained by reading the current in the SL. As can be seen, a voltage vector $V_i$ is applied to the i$^{th}$ row (BLs) while the voltage-induced currents of each memtransistor are collected at the j$^{th}$ grounded columns (SLs). Herein, a total current vector of $I_j = \Sigma_i V_i G_{ij}$ is collected. During conductance states setting of the selected cells, the selected WLs are grounded or positive biased while all of the unselected WLs are floated or negatively biased to completely deplete the carriers in the channel to avoid sneak current. At the same time, the selected SLs are turned on to collect the current while the remaining unselected SLs are turned off by the access transistors to further avoid sneak current flowing through those unselected memtransistor cells. Moreover, each dot product between the input vector and column vector is noninterfering and thus enables semi-parallel programming (column-by-column), which would increase the training efficiency.

Figure 10B:
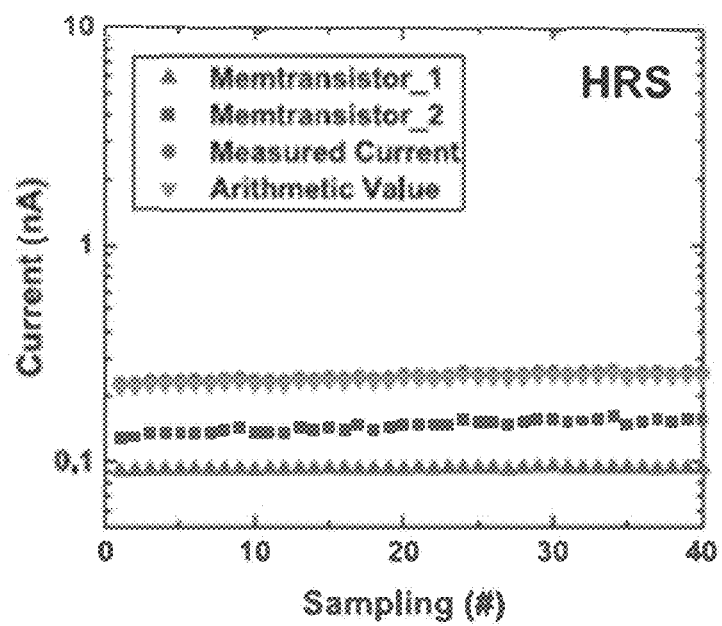
FIG. 10C illustrating the measured and arithmetic currents at a low resistance state (LRS) and FIG. 10D illustrating the currents of two selected memtransistor cells at HRS and LRS, respectively, and the calculated average accuracy.
Figure 10C:
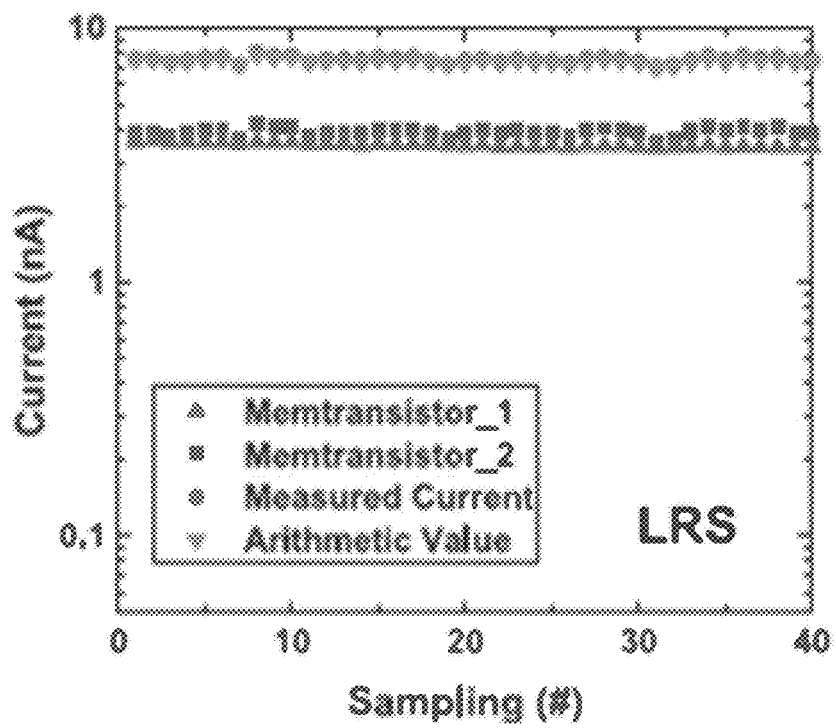
Figure 10D:
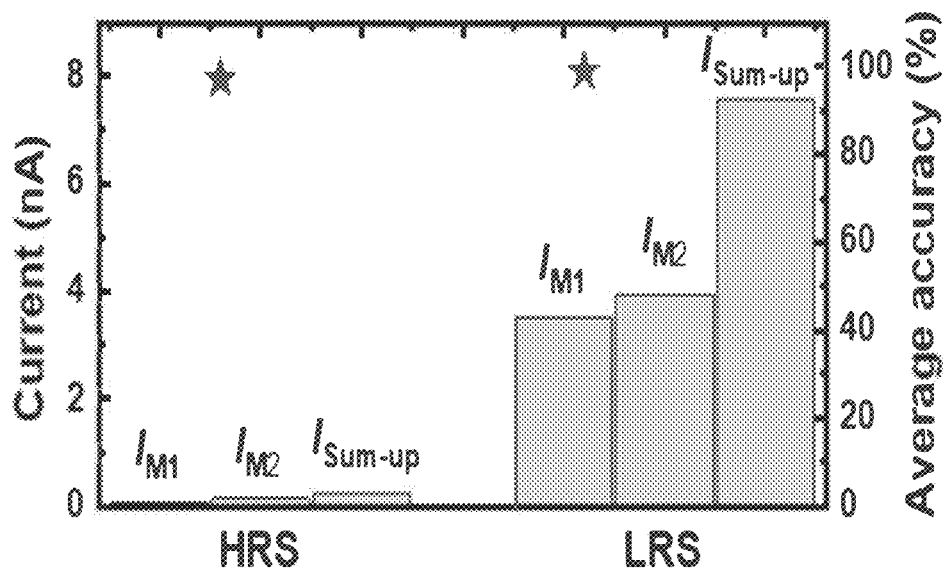

A sub-circuit which consists of two input and one output neurons is then utilized to perform a basic current accumulation operation, as shown in FIG. 10B. FIG. 10B shows the HRS current of two independent cells in the same column and the current that passes through the corresponding SL. In the off state, the current of both memtransistors show a low level of 0.1 nA, which indicates an excellent isolation between the selected and unselected cells with minimal sneak current flowing through. Then the two memtransistors are set into LRS simultaneously with a set voltage of 1 V. After setting into LRS, as shown in FIG. 10C, the programmed states over the initial states show a 10-fold difference for both memtransistor cells. For both the HRS and LRS, the multiplication products equal to the summed current through the SLs, as shown in FIG. 10D. As compared with the arithmetic results, the measured results demonstrate an accuracy of 97.17% and 98.76%, respectively. Overall, the experimental demonstration indicates a good control over gate leakage current and sneak current, which implies its potential to perform VMM using larger scale crossbar arrays.

Synaptic Plasticity and Pattern Classification Simulation

Figure 11A:
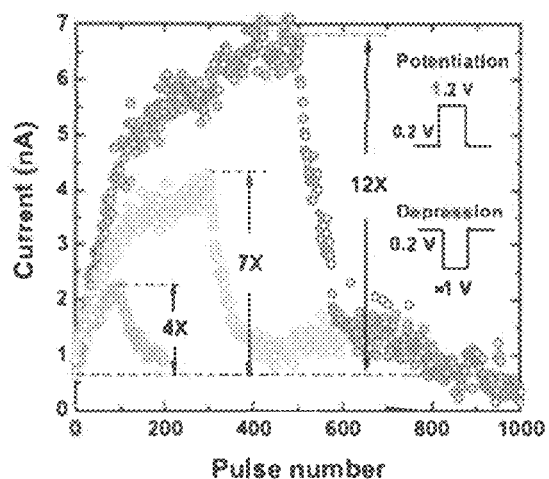
FIG. 11A illustrating the potentiation and depression of a memtransistor cell when a positive/negative pulse train is applied, showing the long-term potentiation (LTP) and long-term depression (LTD), FIG. 11B illustrating the non-linearity of the LTP and LTD of the three pulse train sets illustrated in FIG. 11A, and FIG. 11C illustrating the pulse train of 150 set pulses with a pulse amplitude of 1.2 V and a pulse train of increased pulse amplitude of 1.2 V, 1.4 V, and 1.6 V, each with 50 set pulses.
Figure 11B:
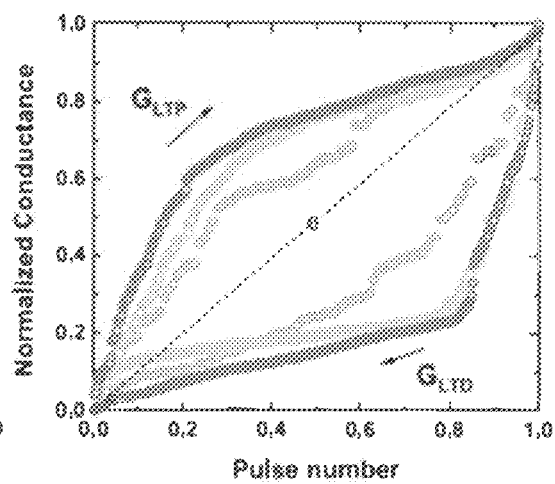
FIG. 11D illustrating a three-layer neural network scheme and FIG. 11E illustrating accuracy evolution as a function of training epochs for the memtransistor crossbar array with the three pulse train sets as shown in FIG. 11A.

To implement VMM-based neural network algorithm, the long-term plasticity which is used to store trained synaptic weights for each layer in the artificial neural network (ANN) is first characterized. FIG. 11A shows the long-term potentiation/depression for three different positive/negative stimulus with a pulse width of 1 ms and a pulse amplitude of 1.2 V. The conductance update shows a gradual and linear increase/decrease manner as compared with filamentary RRAMs which usually experience a sudden drop due to the stochastic dissolution of conductive filaments. Thus, RS based on electric-field mediated defect migration is probably a more reliable mechanism for enabling an analogue conductance update. Moreover, the analogue on/off ratio is increased to more than 10 when the pulse number is increased from 200 (100 potentiation/100 depression) to 1000 (500 potentiation/500 depression). The nonlinearity and symmetry of LTP and LTD are further quantified using a device behavioural model as shown in FIG. 11B. With 200 LTP/LTD pulses, the plasticity behaviour becomes closer to an ideal linear and symmetric learning rule that is desirable for ANNs.

Figure 11C:
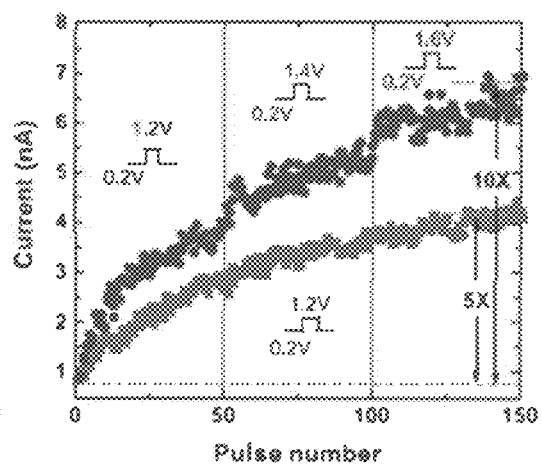

The increased number of pulses enable more conductance states and a larger dynamic range, however, at the expense of a higher nonlinearity after the conductance reaching its maximal value. A mitigation strategy to avoid the saturation is to apply a pulse train with potentiated voltage amplitude. As shown in FIG. 11C, with an increased pulse amplitude from 1.2 to 1.6 V, the dynamic ratio is increased by 10-fold with a stimulation of only 150 pulses, showing a better linearity as compared with a 1.2 V pulse train.

Figure 11D:
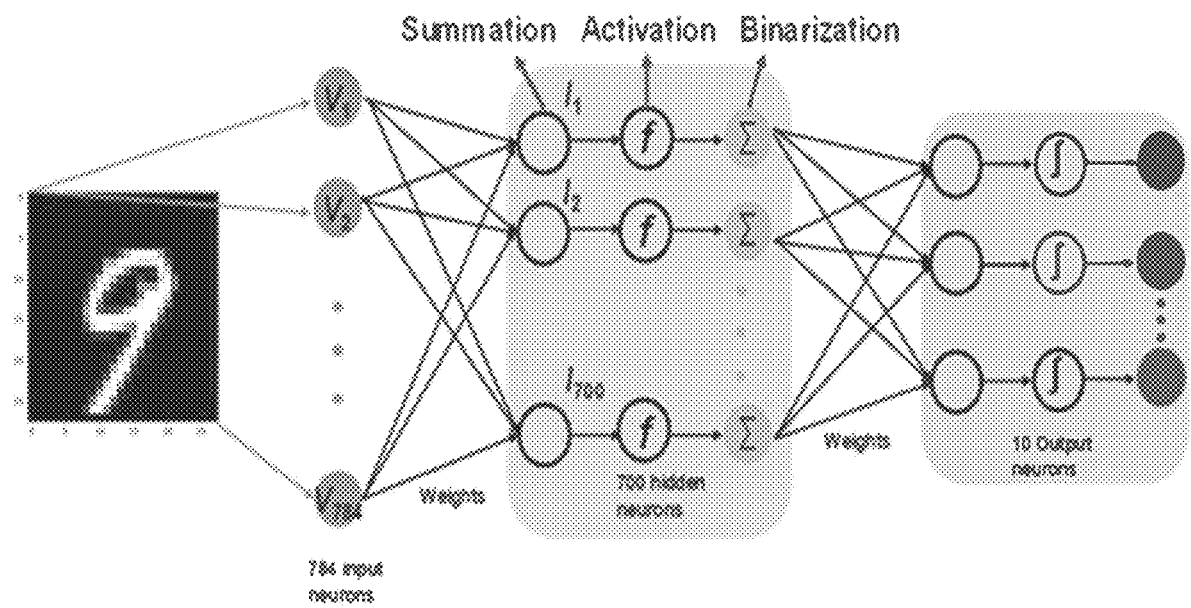
Figure 11E:
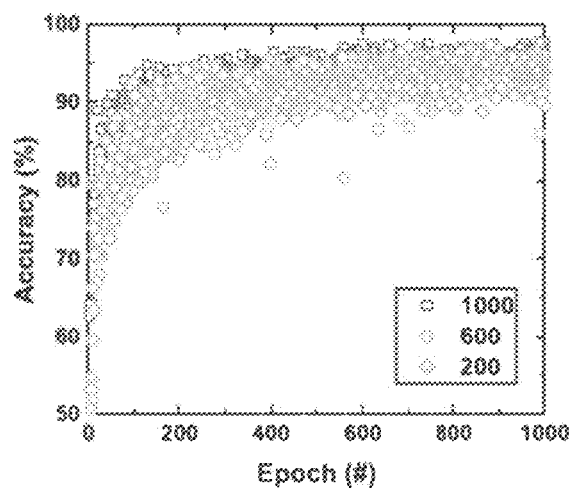

On the basis of the measured characteristics from a standalone memtransistor, pattern classification workload is selected as a case study algorithm wherein an ANN is modelled to perform a supervised learning using the Modified National Institute of Standards and Technology (MNIST) handwritten recognition data set. As schematically shown in FIG. 11D, a fully connected multilayer perceptron (MLP) ANN with 28 by 28 pre-neurons, 700 hidden neurons and 10 output neurons is generated by software. The 784 neurons of the input layer correspond to a 28×28-pixel black-and-white MNIST image, and the 10 output neurons correspond to 10 classes of digits (0-9). The weighted sum of the input vector and the synapse matrix is processed through a sigmoid activation and a binarization function and then propagated to the output layer. The gradient descent optimization algorithm is adopted to adjust and update the weights, wherein the amount of delta weight is calculated and back-propagated to the synapse matrix. The optimization is iterated until the minimized loss function that measures the error between the output and target values is obtained. For the simulation, two non-ideal factors of the memtransistor were considered, that is, the finite number of conductance levels and the device-to-device variation. First, the weights are represented by the measured finite conductance levels in FIG. 11A. Since the weights used in algorithm can be either positive or negative values (WA=−1–1), while the measured weights in FIG. 11A can only represent positive values (WH=0–1), here a reconstruction WA=2 WH−1, is performed to expand WH to the range of WA.18 Second, the device-to-device variation is analyzed by introducing the variation to the weight initialization step. The training set comprises of 60,000 images which are randomly selected from the MNIST data set and a separate testing set of 10,000 images. The simulation results in FIG. 11E show that $MoS_2$ memtransistor ANN can achieve a recognition accuracy of up to 96.87%, which is comparable to the accuracy of other memristors-based ANN.

The above is a description of embodiments of a device and circuit in accordance with the present invention as set forth in the following claims. It is envisioned that others may and will design alternatives that fall within the scope of the following claims.

The invention claimed is:

1. A memtransistor comprising:
   a sapphire substrate having a plurality of well-defined smooth terraces formed on a surface of the substrate;
   a single-layer polycrystalline molybdenum disulphide ($MoS_2$) thin film formed on the surface of the substrate, wherein the $MoS_2$ thin film comprise $MoS_2$ grains oriented along the terraces of the surface;
   a drain electrode and a source electrode formed on the $MoS_2$ thin film such that a channel is defined in the $MoS_2$ thin film between the drain and source electrodes,
      wherein grain boundaries formed by the $MoS_2$ grains in the channel are aligned parallel to a direction of current flow between the drain and source electrodes;
   a gate dielectric layer formed over the $MoS_2$ thin film, the drain and source electrodes; and
   a gate electrode formed above the channel, over the gate dielectric layer.

2. The memtransistor according to claim 1 wherein the alignment of the grain boundaries in the $MoS_2$ thin film enable the memtransistor to have a low switching voltage between 0.4 and 0.7 Volts and a low switching energy between 10 and 10 femtojoule/bit by making grain boundary facilitated S vacancy movements more favourable to be triggered.

3. The memtransistor according to claim 1 wherein the memtransistor is fabricated in a three-terminal field-effect-transistor geometry.

4. The memtransistor according to claim 1 wherein the well-defined smooth terraces are formed on the surface of the substrate by annealing the substrate in air at a temperature range between 900° C. and 1200° C.

5. The memtransistor according to claim 1 wherein the $MoS_2$ thin film is formed on the surface of the substrate via a chemical vapour deposition (CVD) process using molybdenum trioxide ($MoO_3$) powder, sulfur powder and a nickel foam block configured as a sulfur vapour scavenger.

6. A crossbar array circuit comprising a first and a second memtransistor according to the memtransistor of claim 1 whereby:

drain electrodes of the first and second memtransistors are electrically connected to a first bit line terminal,
a gate electrode of the first memtransistor is electrically connected to a first gate terminal,
a gate electrode of the second memtransistor is electrically connected to a second gate terminal, and
source electrodes of the first and second memtransistors are electrically connected to a first source line terminal.

7. The crossbar array circuit according to claim 6 further comprising a third and a fourth memtransistor comprising:
drain electrodes of the third and fourth memtransistors are electrically connected to the first bit line terminal,
a gate electrode of the third memtransistor is electrically connected to the first gate terminal,
a gate electrode of the fourth memtransistor is electrically connected to the second gate terminal, and
source electrodes of the third and fourth memtransistors are electrically connected together to a second source line terminal.

8. A crossbar array circuit comprising a fifth and a sixth memtransistor according to the memtransistor of claim 1 whereby:
drain electrodes of the fifth and sixth memtransistors are electrically connected to a second bit line terminal,
gate electrodes of the fifth and sixth memtransistors are electrically connected to a third gate terminal,
a source electrode of the fifth memtransistor is electrically connected to a third source line terminal, and
a source electrode of the sixth memtransistor is electrically connected to a fourth source line terminal.

9. The crossbar array circuit according to claim 6 wherein a memtransistor from the crossbar array circuit is selected by applying a set voltage $V_{set}$ to a drain electrode of the selected memtransistor, a ground or a positive bias voltage to a gate electrode of the selected memtransistor and switching on an access transistor electrically connected to a source electrode of the selected memtransistor.

10. The crossbar array circuit according to claim 6 wherein a memtransistor from the crossbar array circuit is unselected by applying a floating or a negative bias voltage to a gate electrode of the unselected memtransistor and switching off an access transistor electrically connected to a source electrode of the unselected memtransistor.

11. A method for fabricating a memtransistor comprising:
forming a plurality of well-defined smooth terraces on a surface of a sapphire substrate;
forming a single-layer polycrystalline molybdenum disulphide ($MoS_2$) thin film on the surface of the substrate, wherein the $MoS_2$ thin film comprise $MoS_2$ grains oriented along the terraces of the surface;
forming a drain electrode and a source electrode on the $MoS_2$ thin film such that a channel is defined in the $MoS_2$ thin film between the drain and source electrodes,
wherein grain boundaries formed by the $MoS_2$ grains in the channel are aligned parallel to a direction of current flow between the drain and source electrodes;
forming a gate dielectric layer over the $MoS_2$ thin film, the drain and source electrodes; and
forming a gate electrode over the gate dielectric layer such that the gate electrode is above the channel.

12. The method according to claim 11 wherein the alignment of the grain boundaries in the $MoS_2$ thin film enable the memtransistor to have a low switching voltage between 0.4 and 0.7 Volts and a low switching energy between 10 and 10 femtojoule/bit by making grain boundary facilitated S vacancy movements more favourable to be triggered.

13. The method according to claim 11 wherein the memtransistor is fabricated in a three-terminal field-effect-transistor geometry.

14. The method according to claim 11 wherein the forming of the well-defined smooth terraces on the surface of the substrate comprises the step of:
annealing the substrate in air at a temperature range between 900° C. and 1200° C.

15. The method according to claim 11 wherein the forming of the $MoS_2$ thin film on the surface of the substrate comprises:
utilizing a chemical vapour deposition (CVD) process using molybdenum trioxide ($MoO_3$) powder and sulfur powder to form the $MoS_2$ thin film,
whereby a nickel foam block configured as a sulfur vapour scavenger is provided between the molybdenum trioxide ($MoO_3$) powder and the substrate.

16. A crossbar array circuit comprising a first and a second memtransistor formed according to the method of claim 11 whereby:
drain electrodes of the first and second memtransistors are electrically connected to a first bit line terminal,
a gate electrode of the first memtransistor is electrically connected to a first gate terminal,
a gate electrode of the second memtransistor is electrically connected to a second gate terminal, and
source electrodes of the first and second memtransistors are electrically connected to a first source line terminal.

17. The crossbar array circuit according to claim 16 further comprising a third and a fourth memtransistor comprising:
drain electrodes of the third and fourth memtransistors are electrically connected to the first bit line terminal,
a gate electrode of the third memtransistor is electrically connected to the first gate terminal,
a gate electrode of the fourth memtransistor is electrically connected to the second gate terminal, and
source electrodes of the third and fourth memtransistors are electrically connected together to a second source line terminal.

18. A crossbar array circuit comprising a fifth and a sixth memtransistor formed according to the method of claim 11 whereby:
drain electrodes of the fifth and sixth memtransistors are electrically connected to a second bit line terminal,
gate electrodes of the fifth and sixth memtransistors are electrically connected to a third gate terminal,
a source electrode of the fifth memtransistor is electrically connected to a third source line terminal, and
a source electrode of the sixth memtransistor is electrically connected to a fourth source line terminal.

19. The crossbar array circuit according to claim 16 wherein a memtransistor from the crossbar array circuit is selected by applying a set voltage $V_{set}$ to a drain electrode of the selected memtransistor, a ground or a positive bias voltage to a gate electrode of the selected memtransistor and switching on an access transistor electrically connected to a source electrode of the selected memtransistor.

20. The crossbar array circuit according to claim 16 wherein a memtransistor from the crossbar array circuit is unselected by applying a floating or a negative bias voltage to a gate electrode of the unselected memtransistor and switching off an access transistor electrically connected to a source electrode of the unselected memtransistor.

* * * * *